(12) United States Patent
Zhang (10) Patent No.: US 10,184,959 B2
(45) Date of Patent: Jan. 22, 2019

(54) MAGNETIC CURRENT SENSOR AND CURRENT MEASUREMENT METHOD

(71) Applicant: Murata Manufacturing Co., Ltd., Nagaokakyo-shi, Kyoto-fu (JP)

(72) Inventor: Zhenhong Zhang, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 552 days.

(21) Appl. No.: 14/935,804

(22) Filed: Nov. 9, 2015

(65) Prior Publication Data

US 2016/0061863 A1 Mar. 3, 2016

Related U.S. Application Data

(63) Continuation of application No. PCT/JP2013/003007, filed on May 10, 2013.

(51) Int. Cl.
*G01R 15/20* (2006.01)
*G01R 33/09* (2006.01)
(Continued)

(52) U.S. Cl.
CPC ....... *G01R 15/205* (2013.01); *G01R 19/0092* (2013.01); *G01R 33/093* (2013.01); *G01R 33/123* (2013.01)

(58) Field of Classification Search
CPC ................ G01R 15/181; G01R 15/207; G01R 19/0092; G01R 1/22; G01R 1/203
(Continued)

(56) References Cited

U.S. PATENT DOCUMENTS 5,367,221 A * 11/1994 Santy ................. H04N 9/29
315/8
6,271,456 B1 * 8/2001 Nelson .................. G10H 3/181
84/726
(Continued)

FOREIGN PATENT DOCUMENTS

CN 1898574 A 1/2007
EP 1739444 A2 1/2007
(Continued)

OTHER PUBLICATIONS

Li, L., et al. "Detection of 10-nm superparamagnetic iron oxide nanoparticles using exchange-biased GMR sensors in wheatstone bridge." IEEE transactions on magnetics 49.7 (2013): 4056-4059. APA.*

(Continued)

*Primary Examiner* — Christopher P McAndrew
(74) *Attorney, Agent, or Firm* — Arent Fox LLP (57) ABSTRACT

A magnetic current sensor including a Wheatstone bridge circuit formed of four magnetoresistance devices; bias magnetic field application that applies a bias magnetic field to the magnetoresistance devices; and air-core coils provided on both sides of the Wheatstone bridge circuit. The Wheatstone bridge circuit generates a voltage corresponding to an induction magnetic field generated by a current to be measured flowing through the air-core coils. According to the magnetic current sensor and current measurement method, the linearity between a current and an output voltage is near 0 mA as a result of magnetic hysteresis being suppressed, and an increase in current and a reduction in size and cost are realized as a result of insulation between the current circuit side and the MR device side being excellent.

19 Claims, 8 Drawing Sheets

(51) Int. Cl.
*G01R 33/12* (2006.01)
*G01R 19/00* (2006.01)

(58) Field of Classification Search
USPC .......................................................... 324/126
See application file for complete search history.

(56) References Cited

U.S. PATENT DOCUMENTS

| | | | | |
|---|---|---|---|---|
| 6,304,074 | B1 * | 10/2001 | Waffenschmidt | G01B 7/30 324/202 |
| 7,176,679 | B2 * | 2/2007 | Baragatti | G01R 33/09 324/252 |
| 7,345,476 | B2 * | 3/2008 | Middelhoek | G01R 33/07 324/225 |
| 7,619,431 | B2 | 11/2009 | De Wilde et al. | |
| 2003/0057938 | A1 | 3/2003 | Goetz | |
| 2007/0063690 | A1 | 3/2007 | De Wilde et al. | |
| 2011/0227560 | A1 | 9/2011 | Haratani et al. | |
| 2014/0035570 | A1 | 6/2014 | Insik et al. | |

FOREIGN PATENT DOCUMENTS

| | | |
|---|---|---|
| EP | 1847836 A2 | 10/2007 |
| EP | 2696209 A1 | 2/2014 |
| JP | H06-148301 A | 5/1994 |
| JP | H07-020218 A | 1/1995 |
| JP | 2006-221342 A | 8/2005 |
| JP | 2006-098320 A | 4/2006 |
| JP | 2009-250931 A | 10/2009 |
| WO | WO 2012136134 A1 | 10/2012 |

OTHER PUBLICATIONS

O. Elmatboly, et al; "Giant Magneto Resistive Sensing of Critical Power System Parameters"; Industrial Electronics Society. 2005, IECON 2005, 31st Annual Conference of IEEE, IEEE, Piscataway, NJ. Nov. 6, 2005, pp. 2102-2106.
International Search Report issued for PCT/JP2013/003007, dated Jun. 11, 2013.
Written Opinion of the International Searching Authority issued for PCT/JP2013/003007, dated Jun. 11, 2013.

* cited by examiner

DIRECTION OF MAGNETIC LINE

FIG. 8

MAGNETIC CURRENT SENSOR AND CURRENT MEASUREMENT METHOD

CROSS-REFERENCE TO RELATED APPLICATION

The present application is a continuation of PCT/JP2013/003007 filed May 10, 2013, the entire contents of which are incorporated herein by reference.

FIELD OF THE INVENTION

The present invention relates to a magnetic current sensor and a current measurement method for detecting a current flowing through an electronic circuit or the like by using a magnetoresistance effect.

BACKGROUND OF THE INVENTION

In recent years, in accordance with, for example, the widespread use of electric cars or the introduction of smart meters and power visualization systems, the market for current sensors for these purposes is rapidly increasing. The major four types of current sensor used by the market include (1) a shunt resistance method, (2) a current transformer method, (3) a Hall effect magnetic current sensor, and (4) a magnetic current sensor based on a magnetoresistance (MR) method.

Each of these sensors has limitations. In particular, the current sensor of (1) has a problem in that electric insulation is not easy. Moreover, with regard to the current sensor of (2), theoretically, only an alternate current can be measured. With regard to the current sensor of (3), reproducibility is poor since there exists magnetic hysteresis and the size of the current sensor needs to be increased since the sensitivity of a Hall element is lower than that of an MR device. Finally, with regard to the current sensor of (4), reproducibility is poor since a barber-pole MR device is used and, hence, there exists magnetic hysteresis.

Figure 1:
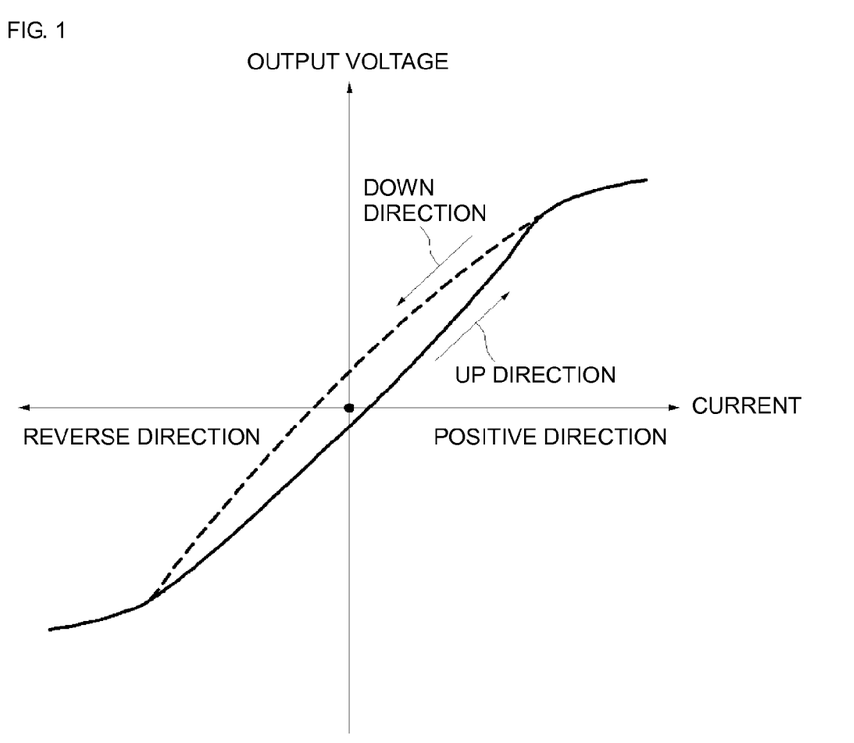
FIG. 1 is conceptual diagram illustrating how hysteresis is generated in the output voltage of a magnetic current sensor owing to magnetic hysteresis.

FIG. 1 illustrates how magnetic hysteresis causes hysteresis to be generated in the output voltage of a magnetic current sensor. In the magnetic current sensor, a difference in output voltage is generated between the upward current direction and downward current direction due to, for example, magnetic hysteresis of an MR device being used. This difference constitutes the hysteresis of the output voltage of the magnetic current sensor. In order to suppress the magnetic hysteresis causing this phenomenon, Patent Document 1 discloses a method of applying a bias magnetic field to the MR device.

Patent Document 1: Japanese Unexamined Patent Application Publication No. 6-148301.

Further enhancement is required in current sensors used in new areas such as electric cars, smart meters, power visualization systems, and the like. In other words, first, further enhancement in the linearity of an output voltage for an input current is required. Second, a function for accurate determination of the polarity (flow direction) of an input current is required. Third, a decrease in the hysteresis of an output voltage between the case in which the input current changes from a low current to a high current (called an up direction) and the case in which the input current changes from a high current to a low current (called a down direction) is required. Fourth, a further increase in current and a further reduction in size are required.

SUMMARY OF THE INVENTION

In view of the above problems, in a magnetic current sensor for detecting a current by using the MR effect, an object of the present invention is to provide a magnetic current sensor and a current measurement method which enable excellent linearity between the current and output voltage near 0 mA as a result of a reduction in magnetic hysteresis and enable an increase in current and a reduction in size and cost as a result of excellent insulation between a current circuit side and an MR device side.

A magnetic current sensor of the present invention includes a Wheatstone bridge circuit formed of four magnetoresistance devices; bias magnetic field application means for applying a bias magnetic field to the magnetoresistance devices; and air-core coils provided on both sides of the Wheatstone bridge circuit. The Wheatstone bridge circuit generates a voltage corresponding to an induction magnetic field generated by a current to be measured flowing through the air-core coils.

In a current measurement method of the present invention, a current is measured by causing a Wheatstone bridge circuit formed of four magnetoresistance devices, to which a bias magnetic field is applied, to generate a voltage corresponding to an induction magnetic field generated by a current to be measured flowing through air-core coils provided on both sides of the Wheatstone bridge circuit.

According to the magnetic current sensor and the current measurement method of the present invention, as a result of magnetic hysteresis being suppressed, the linearity between a current and an output voltage is excellent near 0 mA, and as a result of insulation between the current circuit side and the MR device side being excellent, an increase in current and a reduction in size and cost are realized.

DETAILED DESCRIPTION OF THE INVENTION

Hereinafter, embodiments of the present invention will be described in detail with reference to the drawings. Note that the embodiments described below are restricted in a technically preferable manner to implement the present invention; however, the scope of the present invention is not limited to the descriptions below.

Figure 2:
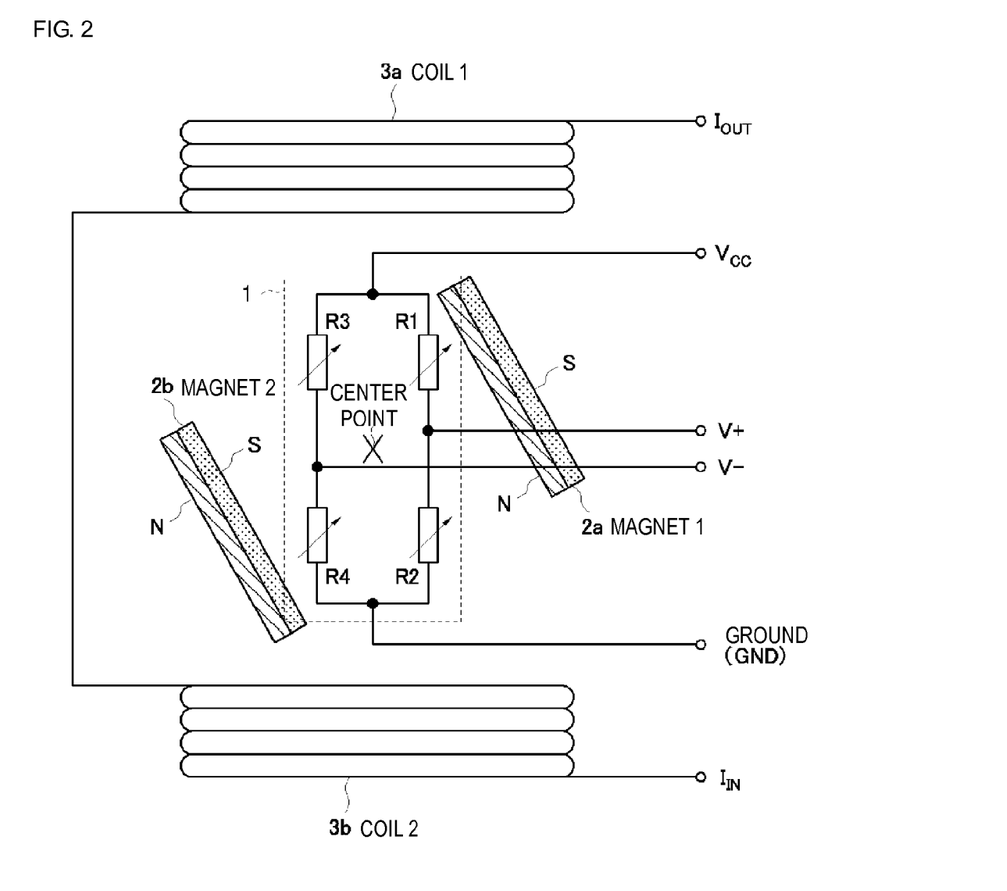
FIG. 2 is a block diagram illustrating the configuration of a magnetic current sensor of an embodiment of the present invention.

FIG. 2 is a block diagram illustrating the configuration of a magnetic current sensor of the embodiment of the present invention. A terminal $I_{IN}$ is a current input terminal. A terminal $I_{OUT}$ is a current output terminal. Terminals V+ and V− are a plus terminal and a minus terminal of a voltage output. A terminal $V_{CC}$ and a terminal GND are terminals on the plus side and ground side of a power supply.

R1, R2, R3, and R4 of a bridge circuit 1 are magnetoresistance (MR) devices, and thin films made of an iron (Fe)-nickel (Ni) alloy (permalloy) may be used. For the purpose of increasing sensitivity and removing in-phase noise, a bridge (Wheatstone bridge) circuit formed of the four MR devices is formed.

A magnet 1 (2a) and a magnet 2 (2b) form a permanent magnet in which a pair of different poles face each other and apply a bias magnetic field to the MR devices. A coil 1 (3a) and a coil 2 (3b) are two identical air-core coils. When a current is made to flow from the terminal $I_{IN}$ to the terminal $I_{OUT}$, the coil 1 (3a) and the coil 2 (3b) generate magnetic fields having polarities in the same direction.

Figure 3:
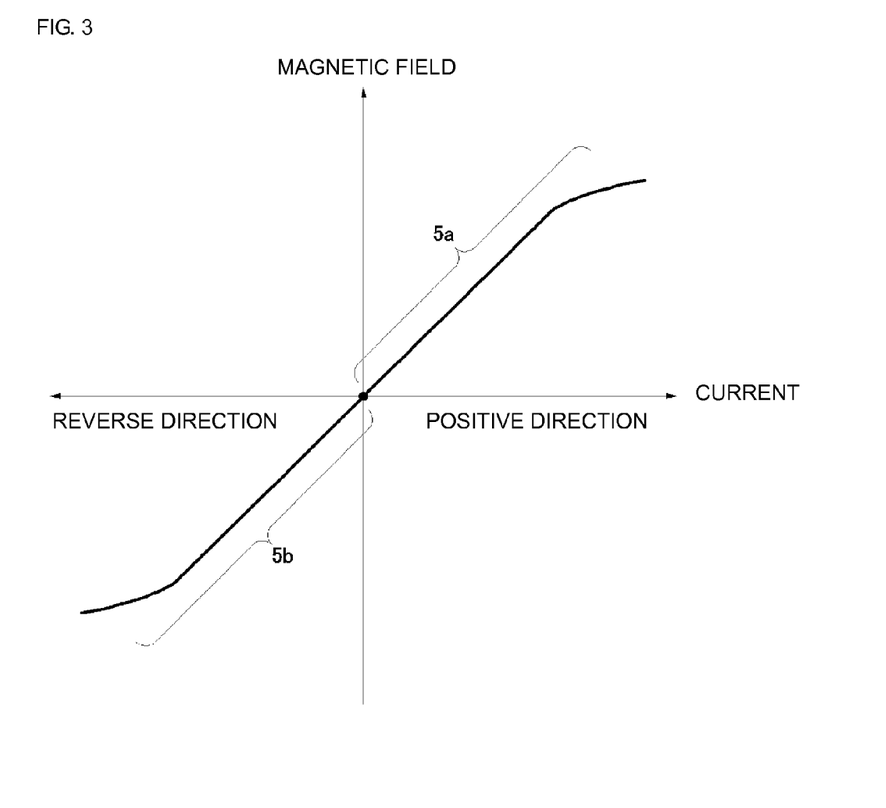
FIG. 3 is a diagram illustrating a relationship between a current and a magnetic field generated by the current at the center point of a bridge circuit 1 in the magnetic current sensor and current measurement method of the embodiment of the present invention.

FIG. 3 illustrates a relationship between a current and a magnetic field generated by the current at a middle point (center point of the bridge circuit 1) between the coil 1 (3a) and the coil 2 (3b) in the magnetic current sensor and the current measurement method of the embodiment of the present invention. When a current flows in a positive direction ($I_{IN} \rightarrow I_{OUT}$), a positive-direction magnetic field 5a is generated. When a current flows in a reverse direction ($I_{OUT} \rightarrow I_{IN}$), a reverse-direction magnetic field 5b is generated.

Figure 4:
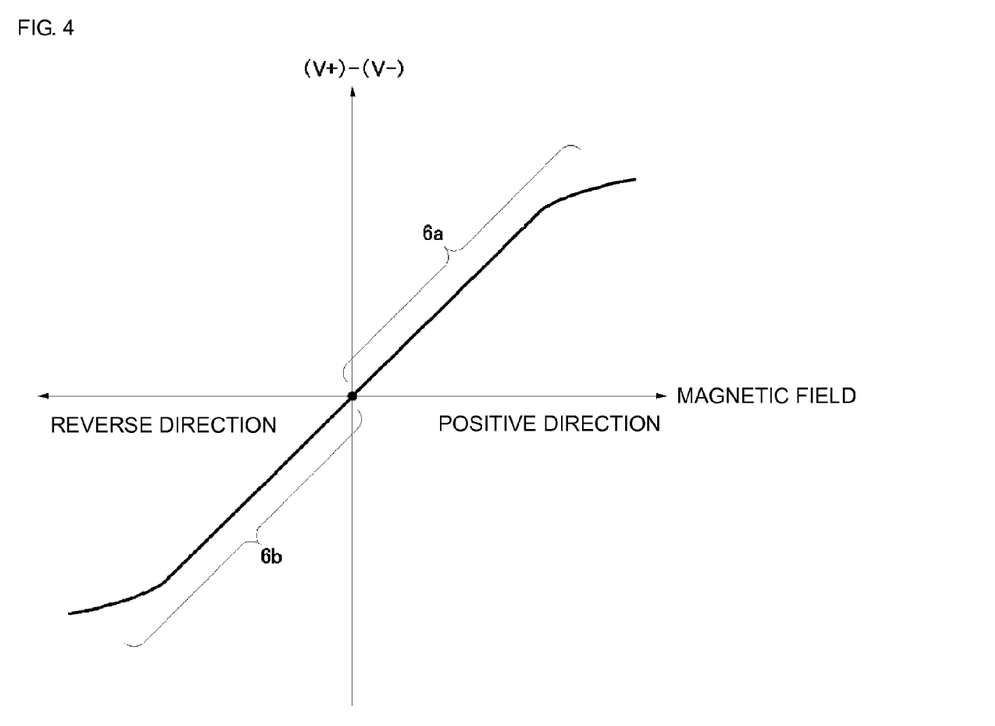
FIG. 4 is a diagram illustrating a relationship between a magnetic field acting on the bridge circuit 1 and an output voltage (V+)-(V−) of the bridge circuit in the magnetic current sensor and the current measurement method of the embodiment of the present invention.

FIG. 4 illustrates a relationship between the magnetic field illustrated in FIG. 3 acting on the bridge circuit 1 and the output voltage (V+)-(V−) of the bridge circuit 1 in the magnetic current sensor and the current measurement method of the embodiment of the present invention. When the magnetic field is in a positive direction, a positive direction voltage 6a is generated as an output voltage and when the magnetic field is in a reversed direction, a reverse direction voltage 6b is generated as the output voltage. As a result of bias magnetic fields being applied to the MR devices R1, R2, R3, and R4 forming the bridge circuit 1 by the magnet 1 (2a) and the magnet 2 (2b), output voltage characteristics without hysteresis are obtained. Note that the bias magnetic fields applied to the MR devices R1, R2, R3, and R4 have approximately the same direction and strength.

Figure 5:
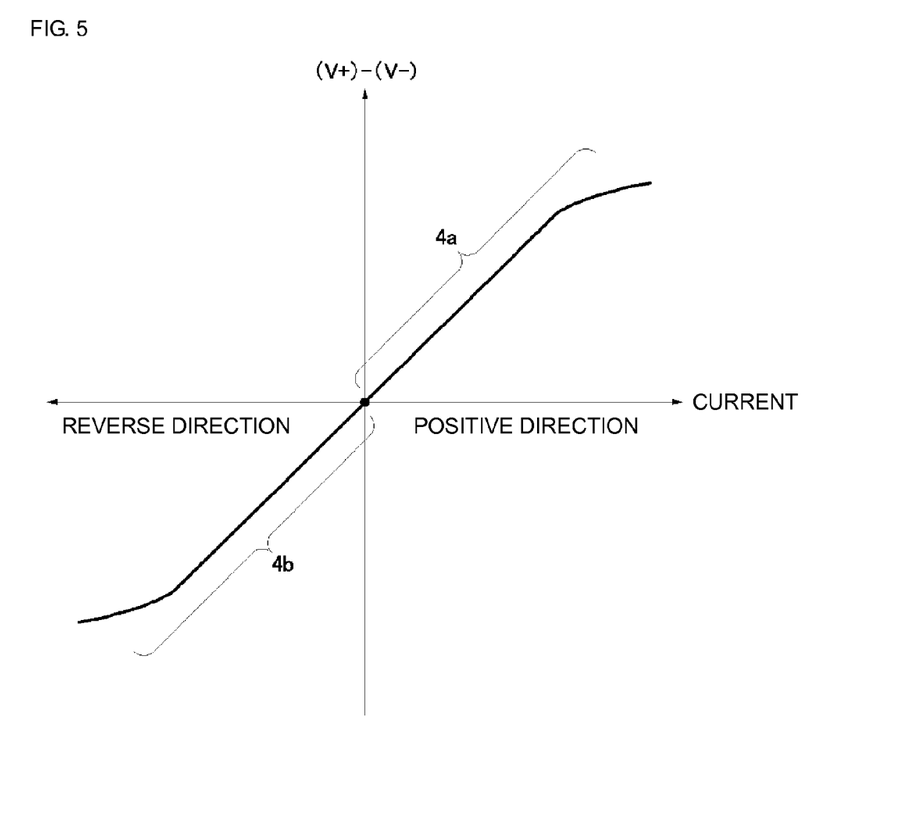
FIG. 5 is a diagram illustrating a relationship between a current and an output voltage in the magnetic current sensor and the current measurement method of the embodiment of the present invention.

FIG. 5 illustrates a relationship between the current and output voltage in the magnetic current sensor and the current measurement method of the embodiment of the present invention. A positive direction output voltage 4a is obtained for a positive direction current ($I_{IN} \rightarrow I_{OUT}$) and a reverse direction output voltage 4b is obtained for a reverse direction current ($I_{OUT} \rightarrow I_{IN}$). As a result of bias magnetic fields being applied by the magnet 1 (2a) and the magnet 2 (2b) to the MR devices R1, R2, R3, and R4 forming the bridge circuit 1, output voltage characteristics without hysteresis are obtained. In particular, linearity between the current and voltage is excellent near 0 mA, i.e., near a portion where the magnetic field due to the current is zero.

Figure 6:
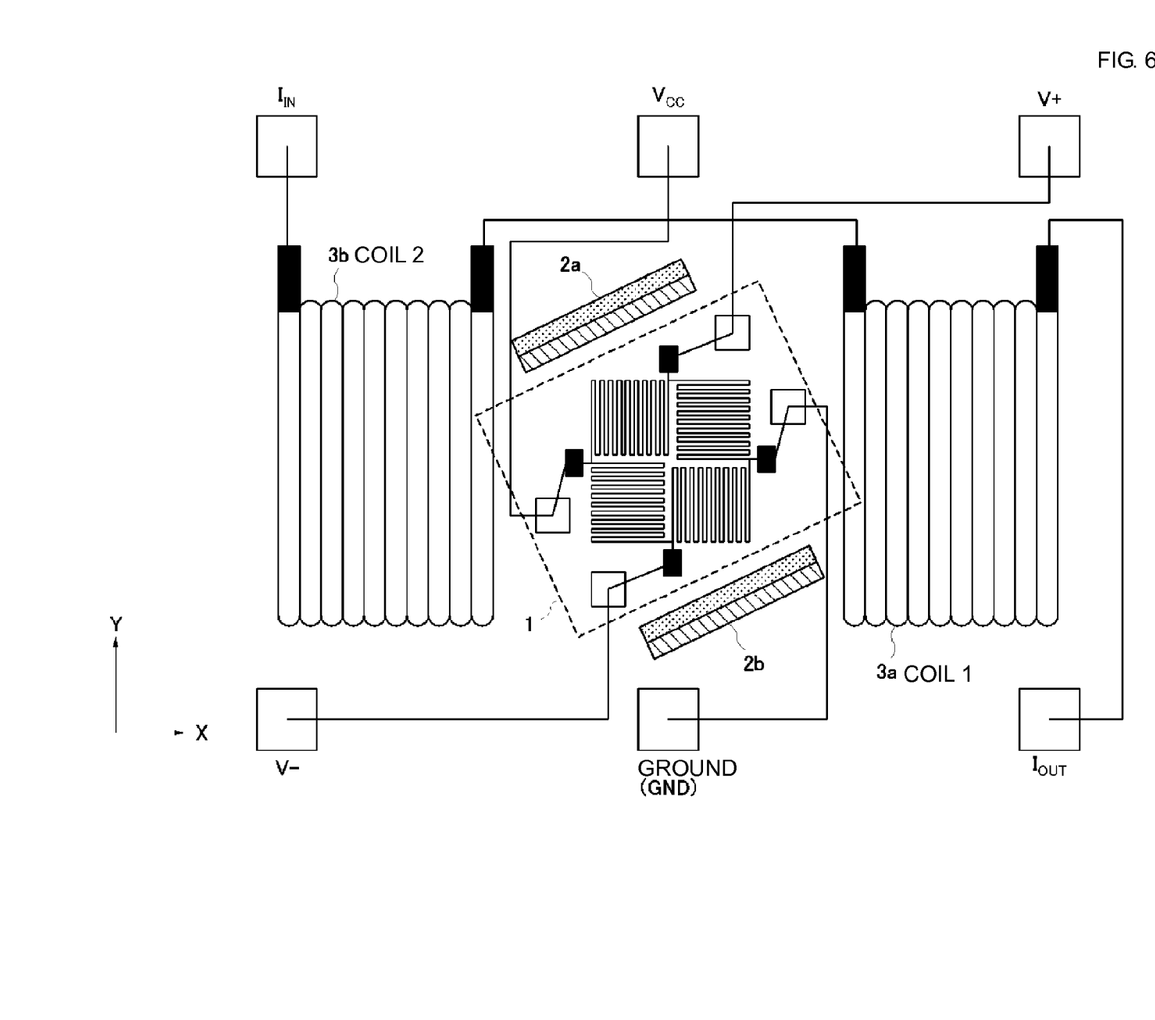
FIG. 6 illustrates a plan view of an assembly diagram of the magnetic current sensor of the embodiment of the present invention.
Figure 7:
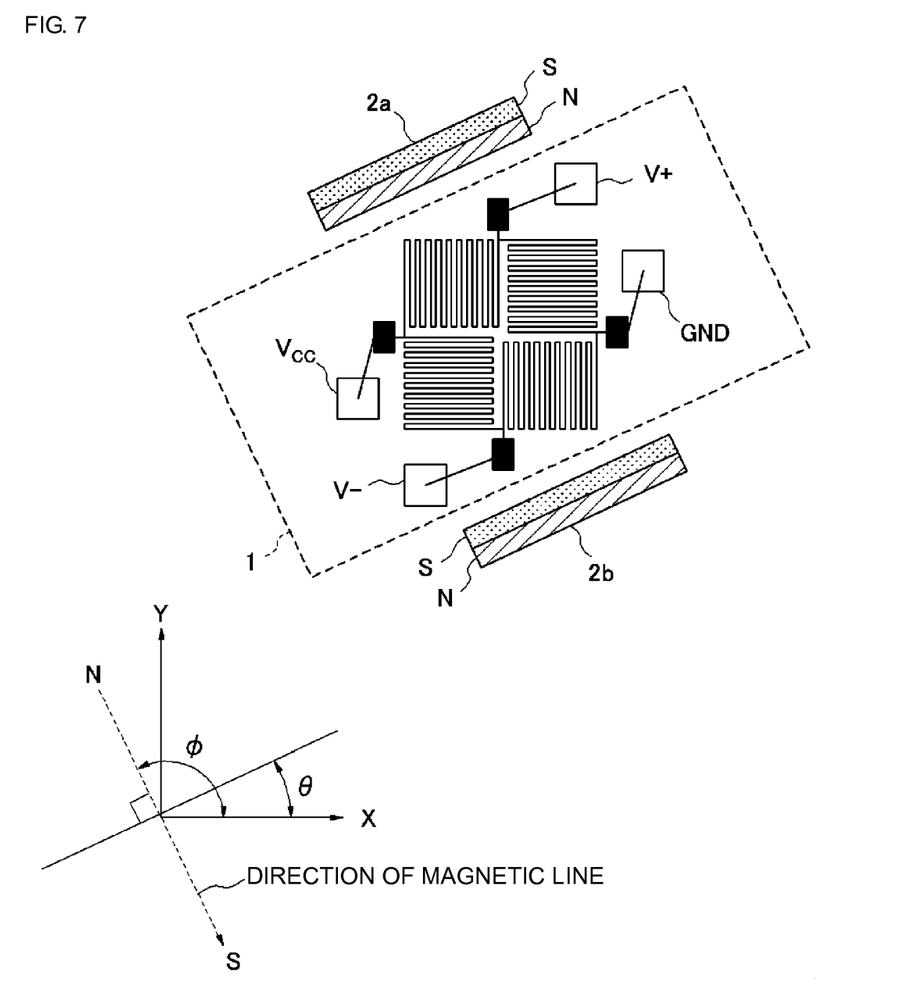
FIG. 7 is an assembly diagram of the bridge circuit 1, a magnet 1 (2a), and a magnet 2 (2b) of the magnetoresistance sensor of the embodiment of the present invention.

FIG. 6 is a plan view of an assembly diagram of the magnetic current sensor of the present embodiment. FIG. 7 is an assembly diagram of the bridge circuit 1 formed of four MR devices and the magnet 1 (2a) and the magnet 2 (2b) that apply a bias magnetic field to the bridge circuit 1 in FIG. 6.

The coil 1 (3a), the coil 2 (3b), the bridge circuit 1 formed of the MR devices, the magnet 1 (2a), and the magnet 2 (2b) are fixed on a single substrate. The air-core direction of the coils and the direction defined by the terminal $V_{CC}$ and the terminal GND of the MR devices are oriented in the X-axis direction.

Figure 8:
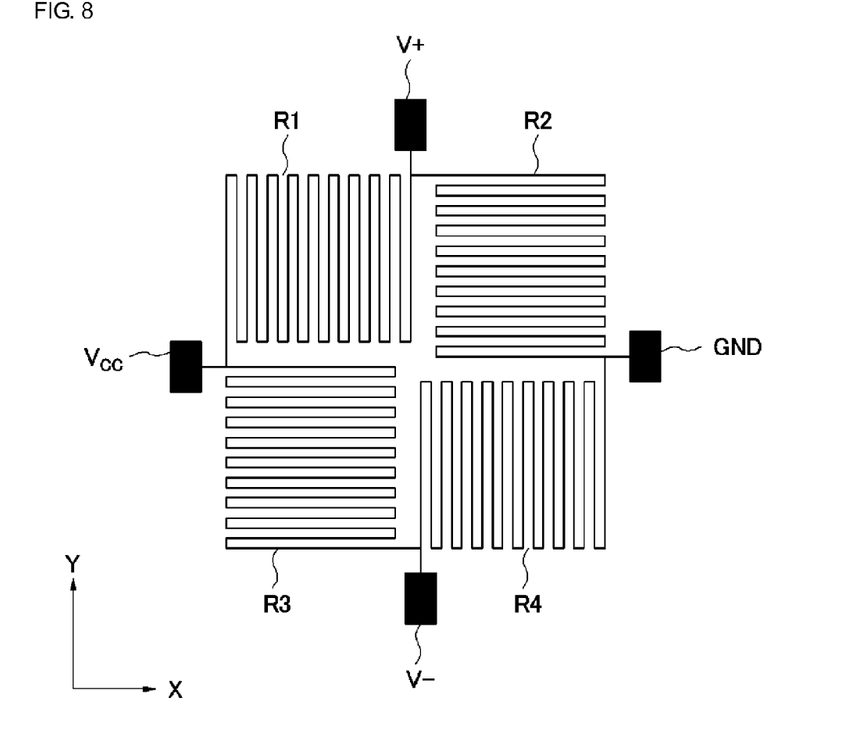
FIG. 8 illustrates a configuration diagram of the bridge circuit 1 of the magnetic current sensor of the embodiment of the present invention.

FIG. 8 illustrates a configuration diagram of the MR devices R1, R2, R3, and R4 forming the bridge circuit 1. An arrangement is made such that the Y-axis direction is the same as the long-side direction of the patterns of the MR devices R1 and R4, and the X-axis direction is the same as the long-side direction of the patterns of the MR devices R2 and R3. In other words, the MR devices R1 and R4 are respectively arranged in zigzag patterns such that the X-axis direction is the same as the maximum detection direction, and the MR devices R2 and R3 are respectively arranged in zigzag patterns such that the Y-axis direction is the same as the maximum detection direction.

The bridge circuit 1 can be manufactured by using a thin film process. In other words, permalloy layers forming MR devices and copper or gold layers forming electrodes are formed by using a sputter method or an evaporation method. Then, photo masks having desired shapes are formed on the respective layers by using photolithography. Then, MR device patterns and electrode patterns having desired shapes are formed by using an etching method such as ion milling.

The magnet 1 (2a) and the magnet 2 (2b) can be formed by using a thin film process as in the bridge circuit 1 or a bulk process in which magnetic materials are molded and assembled. Magnetic materials that can be used include a Ferrite magnet, a Co-based magnet such as a SmCo magnet, and an Fe-based magnet such as a NdFeB magnet.

In FIG. 7, arrangement is made such that a predetermined angle θ is formed between the X-axis direction and the long-side direction of the magnet 1 (2a) and the magnet 2 (2b), i.e., a direction perpendicular to a magnetic line from the magnet 1 (2a) to the magnet 2 (2b). This angle θ is chosen to be preferably between 5° to 85°, and more preferably 26°.

In other words, an angle φ formed between the X-axis direction and the direction of the magnetic field line from the magnet 1 (2a) to the magnet 2 (2b) is preferably between 95° to 175°, and more preferably 116°.

As a result of the magnet 1 (2a) and the magnet 2 (2b) being arranged on both sides of MR devices, a bias magnetic field is applied in both the X-direction and the Y-direction. The strength of the bias magnetic field in the Y-axis direction is made to be saturation magnetic field strength. As a result, the magnetization direction of the MR device becomes the same as the Y-axis direction even when there is no external magnetic field to be detected and, hence, non-continuous movement of a magnetic wall is reduced and hysteresis is also reduced.

Preferably, the bias magnetic field strength in the X-axis direction is set to half the saturation magnetic field strength. The above-described angle θ at which the magnetic field strength in the X-axis direction becomes ½ of the magnetic strength in the Y-axis direction is about 26°. The saturation magnetic field strength can be determined by the size (length, width, and thickness) of the MR device. The bias magnetic field strength in the X-axis moves the operation point of the MR device at the time when the external magnetic field is zero, whereby the linearity between the magnetic field strength and output voltage (V+)-(V−) of the MR devices can be improved.

The diameter and the number of turns of the coil winding wire for the coil 1 (3a) and the coil 2 (3b), forming a current circuit, can be determined by considering the maximum value of a current made to flow therethrough. Further, the coil portion and the MR device portion, which have no overlapping portions, are electrically separated from each other and are in an insulated state. Hence, a current flowing through the coils does not influence the MR devices and, hence, a large current can be made to flow through the coils. Further, the coil portion and the MR portion are arranged so as to be insulated from each other and, hence, a structure for insulation between the two portions, for example, a structure for insulation such as formation of a thick insulation layer is not required, resulting in the advantage of reduced size and low cost.

As described above, according to the magnetic current sensor and current measurement method of the present embodiment, as a result of magnetic hysteresis having been suppressed, the linearity between a current and an output voltage is excellent near 0 mA (i.e., near a point at which a magnetic field due to a current becomes zero) and as a result of insulation between the current circuit side and the MR device side being excellent, a magnetic current sensor and a current measurement method enabling an increase in current and a reduction in size and cost is realized.

Further, since MR devices biased by a magnetic field are used, the magnetic sensor and the current measurement method of the present invention can determine the direction in which a current flows (polarity) and support both DC and AC, and the reduction in size and cost can be advantageously realized since a thin film process can be used for manufacturing.

EXAMPLE

A magnetic current sensor and a current measurement method according to an example of the present invention will be described with reference to FIG. 6, FIG. 7, and FIG. 8. MR devices R1-R4 forming a bridge circuit 1 are made of a thin film which is an alloy (permalloy) of iron (Fe)-nickel (Ni). The thickness of the permalloy thin film is 400 nm. Each of the MR devices has a zigzag shape, and is composed of patterns each having a long-side length of 230 µm and a width of 9 µm. Twenty-one of these patterns are connected to each other so as to form a zigzag shape. The interval between neighboring patterns is 2 µm.

Each of the magnet 1 (2a) and the magnet 2 (2b) forming a pair of permanent magnets has the following dimensions: the length (width of a magnet surface that faces another magnet) is 1.1 mm; the height (depth of a magnet surface that faces another magnet) is 0.6 mm; and the thickness is 0.2 mm. The material of the permanent magnet is samarium cobalt (SmCo). An angle θ formed between the length (width of a magnet surface that faces another magnet) direction and the X-axis direction is 26°. Hence, an angle φ formed between the X-axis direction and the direction of the magnetic field line extending from the N pole to the S pole of the facing permanent magnets is about 116°.

The diameter of the winding wire used for the coil 1 (3a) and the coil 2 (3b) which allow a current of 10 A to flow therethrough is 0.8 mm, and the number of turns is four with two layers. The material of the winding wire is copper.

The MR devices, permanent magnets, and coils described above are fixed and arranged on the same substrate in the assembly step of the current sensor including a sealing step.

According to the magnetic current sensor and current measurement method of the present example, as a result of magnetic hysteresis being suppressed, the linearity between a current and an output voltage is excellent near 0 mA, i.e., near a point at which a magnetic field due to a current becomes zero and as a result of insulation between the current circuit side and the MR device side being excellent, a magnetic current sensor and a current measurement method enabling an increase in current and a reduction in size and cost is realized.

It goes without saying that the present invention is not limited to the embodiment and example described above and that various modifications are possible within the scope of the invention described in the Claims, and these are also included in the scope of the present invention.

Part or the whole of the embodiment described above can also be described as supplemental descriptions shown below, while not being limited to the descriptions below.

Alternative Embodiments (Alternative Embodiment 1)

A magnetic current sensor including: a Wheatstone bridge circuit formed of four magnetoresistance devices; bias magnetic field application means for applying a bias magnetic field to the magnetoresistance devices; and air-core coils provided on both sides of the Wheatstone bridge circuit, where the Wheatstone bridge circuit generates a voltage corresponding to an induction magnetic field generated by a current to be measured flowing through the air-core coils.

(Alternative Embodiment 2)

The magnetic current sensor according to Supplemental description 1, where maximum-magnetic-sensitivity axes of the magnetoresistance devices neighboring each other in the Wheatstone bridge circuit are orthogonal to each other.

(Alternative Embodiment 3)

The magnetic current sensor according to Supplemental description 1 or 2, wherein the induction magnetic field generated by the current to be measured has a direction oriented in a maximum-magnetic-sensitivity-axis direction of the magnetoresistance devices.

(Alternative Embodiment 4)

The magnetic current sensor according to any one of Supplemental descriptions 1 to 3, where an angle between the direction of the bias magnetic field and the maximum-magnetic-sensitivity-axis direction of the magnetoresistance devices is an angle of 95°-175°.

(Alternative Embodiment 5)

The magnetic current sensor according to any one of Supplemental descriptions 1 to 4, where an angle between the direction of the bias magnetic field and the maximum-magnetic-sensitivity axis direction of the magnetoresistance devices is an angle of about 116°.

(Alternative Embodiment 6)

The magnetic current sensor according to any one of Supplemental descriptions 1 to 5, where bias magnetic fields having approximately the same direction and approximately the same strength are applied to the magnetoresistance devices.

(Alternative Embodiment 7)

The magnetic current sensor according to any one of Supplemental descriptions 1 to 6, where the bias magnetic field application means is a permanent magnet.

(Alternative Embodiment 8)

A current measurement method in which a current is measured by causing a Wheatstone bridge circuit formed of four magnetoresistance devices to which a bias magnetic field is applied to generate a voltage corresponding to an induction magnetic field generated by a current to be measured flowing through air-core coils provided on both sides of the Wheatstone bridge circuit.

(Alternative Embodiment 9)

The current measurement method according to Supplemental description 8, where the magnetoresistance devices are arranged such that maximum-magnetic-sensitivity axes of the magnetoresistance devices neighboring each other in the Wheatstone bridge circuit are orthogonal to each other.

(Alternative Embodiment 10)

The current measurement method according to Supplemental description 8 or 9, where the induction magnetic field generated by the current to be measured has a direction oriented in a maximum-magnetic-sensitivity-axis direction of the magnetoresistance devices.

(Alternative Embodiment 11)

The current measurement method according to any one of Supplemental descriptions 8 to 10, where an angle between the direction of the bias magnetic field and the maximum-magnetic-sensitivity axis direction of the magnetoresistance devices is an angle of 95°-175°.

(Alternative Embodiment 12)

The current measurement method according to any one of Supplemental descriptions 8 to 11, where an angle between the direction of the bias magnetic field and the maximum-magnetic-sensitivity axis direction of the magnetoresistance devices is an angle of about 116°.

(Alternative Embodiment 13)

The current measurement method according to any one of Supplemental descriptions 8 to 12, where bias magnetic fields having approximately the same direction and approximately the same strength are applied to the magnetoresistance devices.

(Alternative Embodiment 14)

The current measurement method according to any one of Supplemental descriptions 8 to 13, where the bias magnetic field is applied by a permanent magnet.

INDUSTRIAL APPLICABILITY

The present invention can be widely utilized in current sensors that monitor currents in an electronic automobile, a smart meter, a power system, and the like.

REFERENCE SIGNS LIST 1 bridge circuit
2a magnet 1
2b magnet 2
3a coil 1
3b coil 2

The invention claimed is:

1. A magnetic current sensor comprising:
a Wheatstone bridge circuit including four magnetoresistance (MR) devices;
a pair of magnets with respective opposing poles facing each other with the Wheatstone bridge circuit disposed therebetween, such that the pair of magnets apply a bias magnetic field to the MR devices; and
air-core coils disposed on respective opposing sides of the Wheatstone bridge circuit,
wherein the Wheatstone bridge circuit generates a voltage corresponding to an induction magnetic field generated by a current flowing through the air-core coils, and
wherein a strength of the bias magnetic field is approximately half of a strength of a saturation magnetic field strength.

2. The magnetic current sensor according to claim 1, wherein neighboring MR devices in the Wheatstone bridge circuit comprise maximum-magnetic-sensitivity axes that are orthogonal to each other.

3. The magnetic current sensor according to claim 2, wherein the induction magnetic field generated by the current is oriented in a direction that extends in a direction of the maximum-magnetic-sensitivity axes of a pair of the MR devices.

4. The magnetic current sensor according to claim 2, wherein the bias magnetic field applied by the pair of magnets extends in a direction that intersects the maximum-magnetic-sensitivity axes of a pair of the MR devices at an angle between 95°-175°.

5. The magnetic current sensor according to claim 4, wherein the angle is approximately 116°.

6. The magnetic current sensor according to claim 1, wherein bias magnetic fields applied by the pair of magnets to the MR devices have approximately a same direction and approximately a same strength as one another.

7. The magnetic current sensor according to claim 1, wherein each of the pair of magnets comprise a planar surface.

8. The magnetic current sensor according to claim 7, wherein the planar surface of each of the pair of magnets is parallel to one another.

9. The magnetic current sensor according to claim 8, wherein a first pair of the MR devices in the Wheatstone bridge circuit comprise first maximum-magnetic-sensitivity axes that extend in a first direction and a second pair of the MR devices in the Wheatstone bridge circuit comprise second maximum-magnetic-sensitivity axes that extend in a second direction orthogonal to the first direction.

10. The magnetic current sensor according to claim 9, wherein the planar surface of each of the pair of magnets extend in a third direction that intersects a direction of the first maximum-magnetic-sensitivity axes of the first pair of the MR devices at an angle between 5°-85°.

11. The magnetic current sensor according to claim 10, wherein the angle is 26°.

12. The magnetic current sensor according to claim 1, further comprising a substrate, wherein each of the Wheatstone bridge circuit, the pair of magnets, and the air-core coils are disposed on the substrate.

13. The magnetic current sensor according to claim 1, wherein the MR devices each comprise a length, width, and thickness to define the strength of the saturation magnetic field strength to be twice the strength of the bias magnetic field.

14. A current measurement method comprising:
applying a bias magnetic field to a Wheatstone bridge circuit including four magnetoresistance (MR) devices, the bias magnetic field having a strength that is approximately half of a strength of a saturation magnetic field strength;
generating a voltage corresponding to an induction magnetic field generated by a current flowing through air-core coils disposed on opposing sides of the Wheatstone bridge circuit; and
measuring the current.

15. The current measurement method according to claim 14, further comprising arranging the MR devices such that maximum-magnetic-sensitivity axes of the magnetoresistance devices neighboring each other in the Wheatstone bridge circuit are orthogonal to each other.

16. The current measurement method according to claim 15, further comprising generating the induction magnetic field by the current at a direction oriented in a maximum-magnetic-sensitivity-axis direction of the magnetoresistance devices.

17. The current measurement method according to claim 15, further comprising applying the bias magnetic field in a direction that intersects the maximum-magnetic-sensitivity axes of a pair of the MR devices at an angle between 95°-175°.

18. The current measurement method according to claim 17, wherein the angle is approximately 116°.

19. The current measurement method according to claim 15, further comprising applying bias magnetic fields to the MR devices having approximately a same direction and approximately a same strength as one another.

* * * * *